(12) United States Patent
Lewerenz

(10) Patent No.: US 7,893,347 B2
(45) Date of Patent: Feb. 22, 2011

(54) PHOTOVOLTAIC SOLAR CELL

(75) Inventor: Hans-Joachim Lewerenz, Berlin (DE)

(73) Assignee: Helmholtz-Zentrum Berlin Fuer Materialien und Energie GmbH, Berlin (DE)

( * ) Notice: Subject to any disclaimer, the term of this patent is extended or adjusted under 35 U.S.C. 154(b) by 1266 days.

(21) Appl. No.: 10/575,496

(22) PCT Filed: Oct. 5, 2004

(86) PCT No.: PCT/DE2004/002228

§ 371 (c)(1),
(2), (4) Date: May 18, 2006

(87) PCT Pub. No.: WO2005/036655

PCT Pub. Date: Apr. 21, 2005

(65) Prior Publication Data

US 2007/0028957 A1 Feb. 8, 2007

(30) Foreign Application Priority Data

Oct. 9, 2003 (DE) .................. 103 47 401

(51) Int. Cl.
*H01L 31/00* (2006.01)
(52) U.S. Cl. ..................... 136/255
(58) Field of Classification Search ........... None
See application file for complete search history.

(56) References Cited

U.S. PATENT DOCUMENTS

| 4,748,130 A * | 5/1988 | Wenham et al. ............ 438/98 |
| 5,081,049 A * | 1/1992 | Green et al. ............ 438/71 |
| 2003/0037815 A1* | 2/2003 | Kim et al. ............ 136/256 |
| 2003/0172969 A1 | 9/2003 | Jenson et al. |

FOREIGN PATENT DOCUMENTS

| DE | 4416549 A1 | 11/1995 |
| DE | 198 37 365 A1 | 3/2002 |
| DE | 102008004340 A1 | 7/2009 |
| EP | 1182709 A1 | 2/2002 |
| JP | 61244076 A | 10/1986 |
| JP | 61292381 A | 12/1986 |
| JP | 04015963 A | 1/1992 |
| WO | WO 02/103810 A1 | 12/2002 |
| WO | 2009086820 A2 | 7/2009 |

OTHER PUBLICATIONS

Strollo, Vitale. A close form two dimensional model of a laser grooved solar cell. Aug. 1992, Solid State Electronics, 35, 8, 1109-1118.*

(Continued)

*Primary Examiner*—Alexa D Neckel
*Assistant Examiner*—Miriam Berdichevsky
(74) *Attorney, Agent, or Firm*—Leydig, Voit & Mayer, Ltd.

(57) ABSTRACT

A photovoltaic solar cell (SZ) of improved light-to-current conversion properties is provided with nano emitters (NE) of acicular or rib-like form and are separated from each other at a uniform distance $D \leq \sqrt{2}L$ and penetrating to a penetration depth $$T \geq d_{HL} - \frac{L}{2} + w$$

into the semiconductor layer (HL).

4 Claims, 2 Drawing Sheets

OTHER PUBLICATIONS

Yoshihiro Nakato et al: "Solar Cells 1-4 Based on Anew Junction Transparent Conductor/ Thin Insulator Having Ultrafine Metal Islands/Semiconductor" Proceedings of the Internati onal Photovoltaic Science and Engineering Conference. Kyoto, Nov. 26-30, 1990, Kyoto, Kyoto University, JP, vol. CONF. 5, Nov. 26, 1990, pp. 939-942.

Green Maet al: "20% Efficient Laser Grooved, Buried Contact Silicon Solar Cells" Photovoltaic Specialists Conference. Las Vegas, Sep. 26-30, 1988, New York, IEEE, US, Bd. vol. 1 CONF. 20, Sep. 26, 1988, pp. 411-414, XP000166680.

Jensen J Ad et al: "Electrochemical Deposition of Buried Contacts in High-Efficiency Crystalline Silicon Hotovoltaic Cells" Journal of the Electrochemical Society, vol. 150, No. 1, Jan. 2003, pp. 49-G57, XPOOI090500.

Vettiger P. et al: "The Millipede-Nanotechnology Entering Data Storage" IEEE Transactions on Nanotechnology, vol. 1, No. 1, Mar. 2002, pp. 39-55.

International Search Report mailed on Mar. 10, 2005 which issued during the prosecution of International Patent Application No. PCT/DE2004/002228; 2 pages.

Zhao et al: 22.7% Efficient Perl Silicon Solar Cell Module with a Textured Front Surface; 26th PVSC; Sep. 30-Oct. 3, 1997; Anaheim, CA ce.

Nakato et al.: Effect of Microscopic Discontinuity of Metal Overlayers on the Photovoltages in Metal-Coated Semiconductor-Liquid Junction Photoelectrochemical Cells for Efficient Solar Energy Conversion; J.Phys.Chem. 1988, 92, 2316-2324.

* cited by examiner

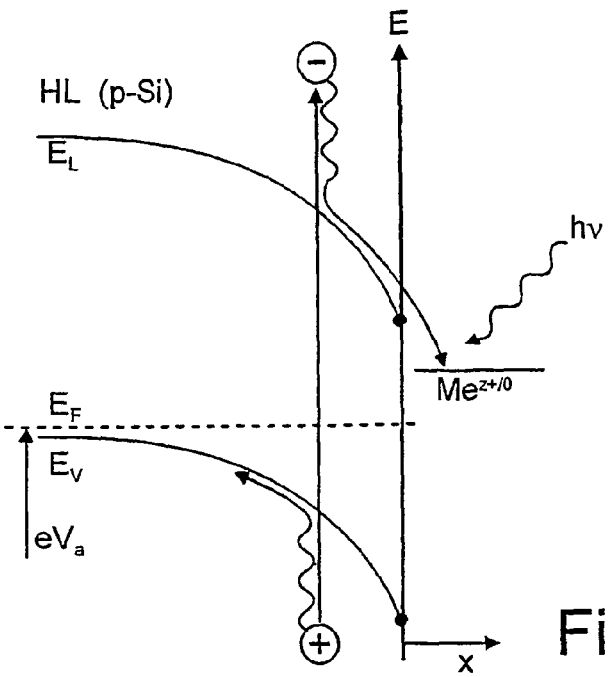
Fig.2
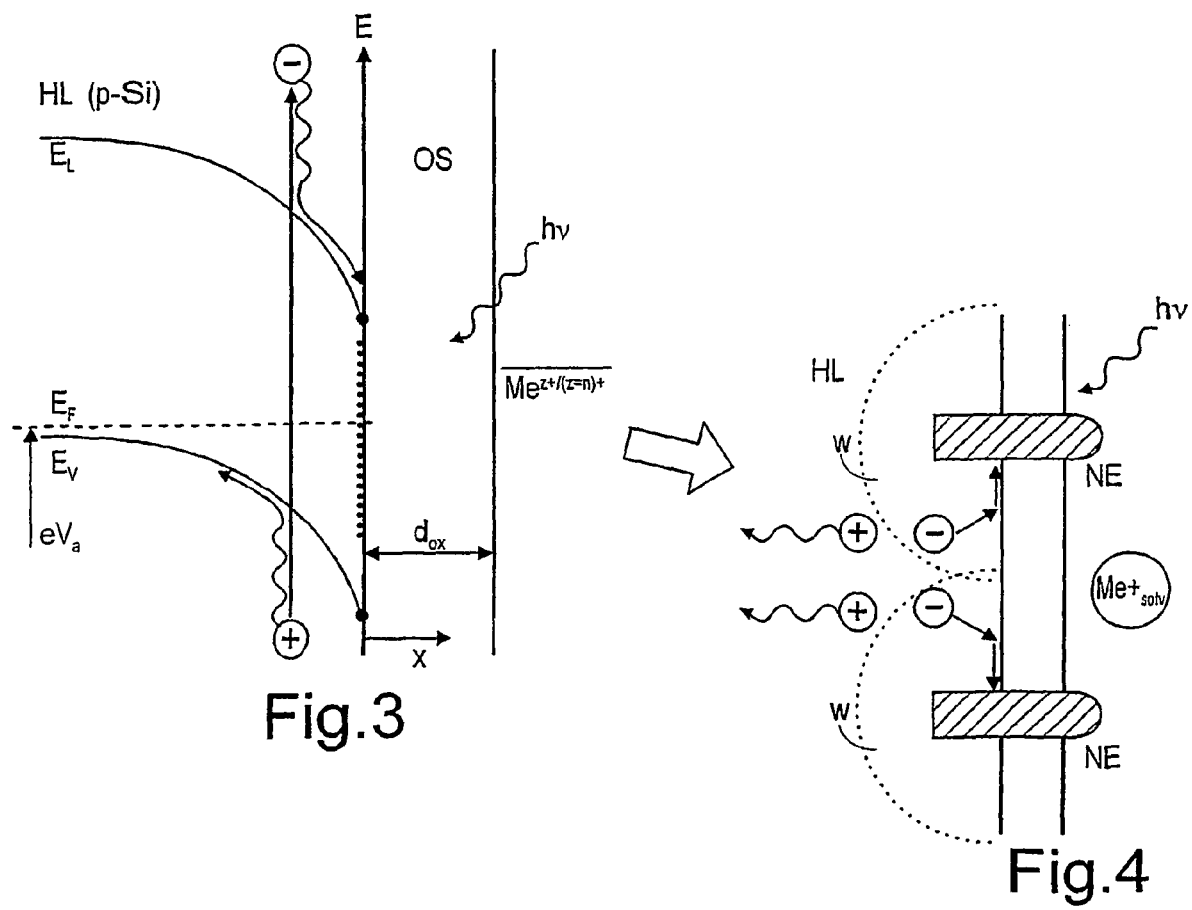
Fig.3
Fig.4

PHOTOVOLTAIC SOLAR CELL

BACKGROUND OF THE INVENTION

1. Field of the Invention

The invention relates to a photovoltaic solar cell with an electrical solid material contact between a semiconductor layer of a layer thickness of $d_{HL}$ and with a plurality of metal nano emitters embedded in an electrically insulating oxide layer disposed on the semiconductor layer and each provided with a space-charge region of dimension w within the semiconductor layer to which the minority carriers migrate over a diffusion length L, and with a transparent conductive layer electrically insulated from the semiconductor layer by the oxide layer as well as with front and rear contacts, and to a method of manufacturing such a solar cell.

2. The Prior Art

In photovoltaic current generation the efficiency of the conversion of impinging sun light to electrical current is of the utmost importance. In order to obtain an optimum yield, aside from reducing losses of reflection and recombination, particular efforts are made to reduce losses from shadows on the light irradiation surface and to improve the collection of light. Shadows on the light irradiation surface result especially from the front contacts, the transparent electrically conductive layer, for instance ITO, and from the emitter layer in the case of Schottky-type solar cells with a solid material contact between the doped semiconductor layer and a rectifying metal layer. The same is true of simple p-n-transitions between a normally doped and a highly doped semiconductor layer. For purposes of an efficient photovoltaic conversion of energy between solid material contacts the emitter layer may be applied as a very thin uninterrupted layer on the semiconductor layer operating as the base or absorber. This may be done by vacuum processes, such as PVD, and diffusion processes. Furthermore, dot-contact solar cells have been proposed which on their rear surface are provided with an optimized dot-contact pattern in direct contact with highly doped insertion zones in the absorber layer (see publication I by J. Zhao et al.: "22.7% efficient pearl silicon solar cell module with a textured front surface", 26th PVSC, 1197, Anaheim, Calif., pp. 1133-1136, FIG. 2). From this publication, pyramidal structuring of the cell surface in the region of the uppermost layers, including the emitter layer, for the prevention of refections, are also known. However, in the area of the of this surface structuring the depth of penetration of the emitter layer into the semiconductor layer of correspondingly conforming structure is relatively minor. The front contacts are applied as strips as narrow as possible in order to reduce losses from shadows and thus to increase the conversion efficiency of the solar cell. The emitter layer is applied as a closed surface and is more highly doped beneath the contact strips than in the area of directly impinging sunlight. Furthermore, for purposes of reducing shadow losses it is known from WO 02/103810 A1 to structure the front contact as wedge-like troughs which are narrower than simple contact strips but which have a greater depth of penetration into the emitter layer and the semiconductor layer positioned below it (buried contact). However, no significant improvement in efficiency can be achieved in view of the fact that the main light collection takes place in the area of the contact-free emitter-absorber transition with increased depth of penetration. For improving the efficiency, it is known from Japanese abstract JP 04015963 A to insert individual emitter regions deeply into the absorber layer in order to prevent recombinations (buried insular regions). However, each emitter region is connected to a front contact strip by its own contact hole. A similar approach of the semiconductor material is known from DE 198 37 365 A1 which teaches the insertion of clusters into the active absorber layer for providing additional charge carriers. For using additional wavelength ranges of the sunlight this leads to changing the optical properties of the semiconductor. However, the clusters grow with inherent defects and are thus difficult to control in terms of their distribution and size.

The state of the art upon which the present invention is based, is disclosed by Publication II by H. Tsubomura et al.: "Effect of Microscopic Discontinuity of Metal Overlayers on the Photovoltages in Metal-Coated Semiconductor-Liquid Junction Photoelectrochemical Cells for Efficient Solar Energy Conversion". This publication aims primarily at improving the catalysis of the photo-chemical process in an electrolytic solar cell (PEC). The application of catalytically active metal films resulted in a solid material contact which, structured as a Schottky contact, is necessarily inferior to a p/n semiconductor contact since it leads to increased losses from charge carrier recombination. The quantity of the current losses occurring at the semiconductor-metal-contact may, however, be reduced by replacement of the continuous metal film by very small (diameter in the range of several nm) metal islands as metallic nano emitters which cover but a small portion of the surface. These metal dot contacts are fabricated by etching of a metal film on a silicon diode. However, in an aqueous electrolyte the latter immediately forms an oxidic insulating layer. In this manner, the semiconductor-electrolyte-contact is replaced by a pure solid material contact in which in addition to catalytically active metal islands an insulating oxide layer covers most of the surface. In discussing his publication, Tsubomura states that his approach of reducing current losses can be applied to a solid material solar cell if instead of the redox electrolytic solution a transparent conductive layer is applied to the oxide layer. However, Tsubomura makes no statements relating to dimensional rules regarding size and distribution of the metal islands. The islands are disposed on the surface of the semiconductor layer at a relatively large distance from each other (four times their diameter), so that the efficiency attainable particularly in solid material solar cells is not fully satisfactory.

OBJECT OF THE INVENTION

Accordingly, the object of the invention is to be seen as so further to improve the photovoltaic solar cell described supra that a further improvement in the efficiency of the photovoltaic energy conversion can be achieved with two solid material contacts. In this connection, a preferred method of fabricating such a highly efficient solid-material solar cell is to be economical and energy conserving.

SUMMARY OF THE INVENTION

In the accomplishment of this object there is thus provided in a solar cell of the kind referred to with an electrical solid material contact between a semiconductor layer of a $d_{HL}$ layer thickness and a plurality of metal nano emitters each having a space-charge region of a dimension w in the semiconductor to which the minority carriers in the semiconductor migrate over a diffusion length L, that the metallic nano emitters are of acicular or rib-like structure and are disposed at a uniform space $D \leq \sqrt{2}L$ from each other as well as a depth of penetration $$T \geq d_{HL} - \frac{L}{2} + w$$

into the semiconductor layer.

In the solid material solar cell metal nano emitters are used with a predetermined homogenous density distribution dependent upon the occurring minority carriers or their length of diffusion in the semiconductor, thus ensuring minimum use of material at an optimum freedom from shadows of the absorbing semiconductor layer by the second solid material contact and minimum recombination losses. Thus a high conversion efficiency can be achieved in the current collection. In accordance with the invention, the current collection is further significantly improved by the metal nano emitters being now structured three-dimensionally in an acicular or rib-like manner and penetrating deeply into the semiconductor layer. By contrast, the metal nano emitters of the prior art are two-dimensionally structured in a dotted fashion and are present only at the surface of the absorbing semiconductor. Also, the depth of penetration of the metal nano emitters in accordance with the invention can be precisely calculated as a function of the relevant parameters of length of diffusion L, space charge zone w and layer thickness $d_{HL}$ of the semiconductor layer, and can thus be optimized. In accordance with an advantageous embodiment of the invention the metal nano emitters in the semiconductor layer may have lateral branches thus resulting in a tree-like structure. Furthermore, they may extend obliquely within the semiconductor layer so that all regions of the layer may be optimally reached by the nano emitters. Thus, in the solar cell in accordance with the invention, the entire layer thickness of the absorbing semiconductor layer up to the rear contact may be used for energy conversion thus yielding optimum efficiency in the collection of the light-generated minority carriers while avoiding recombination effects. Dotted nano emitters can only achieve a depth of penetration as a function of the simple length of diffusion so that for taking up the entire absorbing semiconductor layer it must be structured correspondingly thin. On the other hand, for light collection of approximately 90% the layer thickness of the semiconductor layer has to be greater than three times the absorption length $1/\alpha$ with the coefficient of absorption $\alpha$ which may lead to overlapping marginal conditions and attendant lower efficiency.

In consequence of the penetration into the depth of the absorbing semiconductor layer, the invention makes possible the use of semiconductor materials which are not of first class quality, i.e. materials of lesser diffusion length of the minority carriers. This results in a noticeable cost reduction. Furthermore, crystalline materials and epitaxially grown layers of, for instance, Si, GaAs and InP may be made significantly thinner in view of the fact that in the solar cell in accordance with the invention the red sensitivity in the collection near the rear contact is significantly improved. This is particularly true if, in accordance with one embodiment of the invention a reflective layer is applied to the rear surface of the semiconductor layer in front of the rear contact. According to a further embodiment of the invention a further improvement of the conversion efficiency results from applying an antireflection coating to the transparent conductive layer. This may be, for instance, a layer with a positive or negative pyramidal structure or with some other micro-structuring which safely catches impinging light and conducts it to the absorber.

The use of metal for the nano emitter results in a Schottky contact. The metal must be selected such that it forms a rectifying contact. Thus, for p-doped semiconductor material a metal of a low work function and for n-doped semiconductor material a metal of a higher work function must be selected. Schottky solar cells offer the advantage that they form a diode contact simply by applying a metal to the semiconductor layer. There is no need for complex and complicated doping processes and stability tests at differently doped areas. It should, however, to be noted at this point that the nano emitters may also consist of semiconductor material. The use of a highly doped semiconductor material as a nano emitter results in an efficient p-n-transition provided the semiconductor materials are correspondingly doped in an opposite manner. In accordance with the invention, the shadowing of the absorbing semiconductor layer and the use of material may be kept particularly low by a size of nano emitters in the nm range (preferably between 10 nm and 100 nm). However, dimensions of nano emitters down to the µm range are possible as well. The nano emitters may be grown directly on the semiconductor layer, or they may be applied as a colloid. On the semiconductor layer, they are surrounded by the oxide layer and may slightly extend beyond it. Thus the nano emitters may extend into the transparent conductive layer applied to the oxide layer. The absorbing semiconductor may, but need not, be doped (p- or n-doped). Though extremely pure, so-called float zone (FZ), silicon is nominally undoped, yet it is slightly n-conductive. It is used for high-efficiency solar cells. So-called "Czochralski (CZ) silicon does not reach the quality of FZ silicon so that it requires doping. The oxide layer may be a native oxide such as, for instance, $SiO_2$ which is anodically grown by an exposure or application of a potential. Further details regarding the structure may be taken from the description of possible methods of fabrication set forth infra.

It is also an object of the invention to provide a method of fabricating a photovoltaic solar cell having the claimed structure and which is cost-efficient and requires low energy consumption. In a preferred method, this object is accomplished by the following process steps:

wet-chemical or electrochemical or photo-electrochemical application of an electrically insulating oxide layer of high electronic quality on a semiconductor layer;

structuring the oxide layer by dotted or linear removal of the oxide layer at the locations provided for applying the nano emitters;

wet-chemical or electrochemical or photo-electrochemical acicular or rib-like etching of the structure in the oxide layer down into the semiconductor layer;

light-induced or potential-controlled electrochemical precipitation from a redox electrolyte of metal into the structure in the oxide layer and into the semiconductor layer;

wet-chemical or electrochemical or photo-electrochemical application of a transparent conductive layer on the oxide layer; and application of front and rear contacts.

In accordance with a preferred embodiment the oxide layer may be structured by a wet-chemical or electrochemical or photo-electrical process so that the fabrication process of the solar cell may be continuously performed wet-chemically or electrochemically or photo-electrochemically in a range of low temperatures. The application of the front contacts, for instance contact blades, being normally carried out by vapor deposition, is excluded from this. This is, however, a standardized process which does not increase either the complexity or costs of the process. On the other hand, the fabrication is significantly affected by the process parameters. In this context, the invention, by avoiding high temperatures and changing processes, may yield a significant improvement in the process. The wet-chemical/electrochemical processes may be scaled slightly upwardly and may be used for producing large surfaces as is well-known from galvanic processes.

Precise positioning and maintaining the dimensions of the nano emitters by precisely structuring the oxide layer and the semiconductor layer are important as regards improving the efficiency of the solar cell with specially structured metal nano emitters described supra. In technological applications, the oxide layer may be structured, for instance, by electron beam lithography or by ion beam etching (FIB=focused ion beam etching). Alternatively, but still without applying high temperatures, the oxide layer, which may consist of ZnO, $SnO_2$ or ITO, may be structured, in accordance with a further embodiment of the process, by scanning probe microscopy which would result in a still more precise and controlled definition of the nano emitter positions. In this context, two basic possibilities exist: On the one hand the oxide layer may be scanned in a selected surface area by AFM (atomic force microscopy) with a sufficiently high hold-down force. This process results in the oxide layer being correspondingly shifted laterally and in the semiconductor layer disposed under it to be exposed. On the other hand it is possible by means of AFM to form an indentation with a diamond needle by which the oxide layer is penetrated for the formation of a contact. In accordance with a further embodiment of the invention it is also possible in mechanically structuring the oxide layer to provide a plurality of indentations by parallel embossing for structuring an oxide layer of large surface. By this so-called millipede technique a large number (several hundred) of indentations are simultaneously carried out by AFM (atomic force microscopy), for instance. For large-scale applications in particular such structuring is of particular interest in connection with a large-scale continuous electrochemical/wet-chemical fabrication. In order to cure deformations possibly occurring during the indenting or scratching, the structures, in accordance with a further embodiment of the method, may subsequently be subjected to careful chemical or electrochemical etching of the positions of the removed oxide layer followed by a potential, current or charge-controlled application of an electrically insulating anodic oxide layer (1 to 3 atom layers) on the structure of the semiconductor layer prior to precipitation of metal. This process serves to suppress recombination processes at and in the vicinity of defects.

The surface structuring of the oxide layer is followed by a process step for deepening the structures into the semiconductor layer. This is carried out by wet-chemical or electrochemical or photo-electrochemical etching. Commencing from dot structures in the oxide layer, there will result acicular or porous recesses. Linear structures in the oxide layer are deepened to ribs or troughs. The etching is a simple yet precise operation since the surface of the semiconductor which is not to be etched is securely protected by the oxide layer. The depth of etching may be precisely defined by the corresponding parameters of material and time. The same is true in respect of possible etching of lateral branches which may proceed from the central acicular or rib-like etching recesses, as well as of recesses extending obliquely within the semiconductor layer. An importance process step is the subsequent filling of the acicular or rib-like recesses and of possible lateral branches, i.e. the local precipitation of the metal nano emitters. In this connection, a light-induced or potential-controlled electrochemical precipitation of metal is carried out. The precipitation in the lateral can be safely ensured. In connection with light precipitation the metal is selected such that a rectifying Schottky contact results. The semiconductor may be p-doped or n-doped or not be doped at all. In the case of n-semiconductors the metal precipitation occurs in the dark by forming negative accumulation layers. To prevent repetitions, reference is made to the specific description in connection with the corresponding drawings as regards the precise operation during the light-induced precipitation. An alternative preparation may be carried out by introducing a metallic colloid into the acicular or rib-like recesses in the semiconductor layer. After introduction of the colloid the exposed surface areas of the semiconductor layer are electrochemically oxidized so that the desired nano emitter structure is then embedded in an oxide layer. Process steps following the formation of the nano emitters may in further embodiments include the application of a reflexive layer on the rear surface of the semiconductor layer and/or the application of an antireflective layer on the transparent conductive layer. Both of these additional layers serve further to improve the efficiency as has already be set forth in connection with the solar cell in accordance with the invention.

DESCRIPTION OF THE SEVERAL DRAWINGS

The novel features which are considered to be characteristic of the invention are set forth with particularity in the appended claims. The invention itself, however, in respect of its structure, construction and lay-out as well as manufacturing techniques, together with other objects and advantages thereof, will be best understood from the following description of preferred embodiments when read in connection with the appended drawings, in which:

FIG. 2 is an energy band position diagram of the light-induced local precipitation of the nano emitters in the area of the nano emitters;

FIG. 3 is an energy band position diagram of the light-induced local precipitation of the nano emitters in the area of the oxide layer; and FIG. 4 is a detailed view relating to the light-induced precipitation of the nano emitters.

DETAILED DESCRIPTION OF THE PREFERRED EMBODIMENTS

Figure 1:
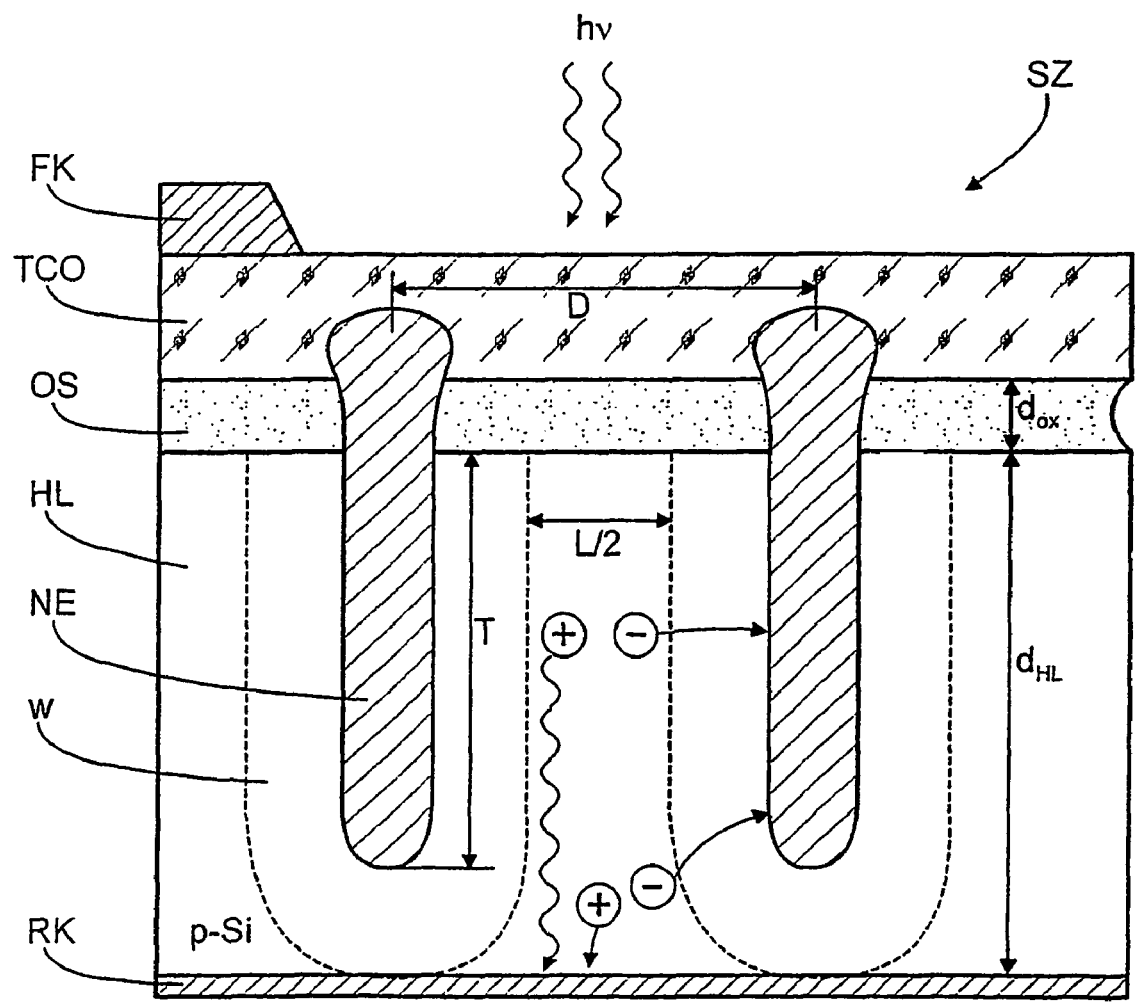
FIG. 1 is a cross-sectional view of an embodiment of a solar cell in accordance with the invention.

FIG. 1 depicts a photovoltaic solar cell SZ having an electrical solid material contact between a doped semiconductor layer HL of layer thickness $d_{HL}$ and a plurality of metal nano emitters NE embedded in an electrically insulating oxide layer OS on the surface of the semiconductor layer HL. Given an appropriate selection of the metal there will result a rectifying Schottky contact with the semiconductor layer HL. In the semiconductor layer HL the rectifying nano emitters NE generate a space charge zone (depleted range) of extent w. Upon exposure, provided the impinging light energy hv is greater than the work function $E_g$ of the charge carriers, pairs of electron holes will be formed in the semiconductor layer HL. The minority carrier (electrons for p-silicon as the semiconductor, holes or "defect electrons" for n-silicon) migrate at a diffusion length L to the metal nano emitters NE acting as a sink. A particularly efficient conversion of solar energy will be achieved if the distance D between the nano emitters NE is:

$$D \leq \sqrt{2}L.$$

In case of uniformity the optimum distance between the metal nano emitters NE will have been obtained which ensures minimum shadowing and minimum use of material.

Where the distance D is less than an upper limit there will be a corresponding overlap with an attendant higher use of material but which nevertheless ensures a safe utilization of the semiconductor layer HL in the corresponding radial plane. Where the metal nano emitters NE are exclusively disposed on the surface of the semiconductor layer HL the efficient utilization would be limited to the uppermost layer of the semiconductor layer HL. In order to achieve total utilization the layer $d_{HL}$ of the semiconductor layer HL should not be greater than the diffusion length L of a given minority carrier. In the solar cell SZ in accordance with the invention the metal nano emitters NE also extend into the depth of the semiconductor layer HL, thus resulting in the advantageous inverse case. A depth of penetration $$T \geq d_{HL} - \frac{L}{2} + w$$

will be defined as a function of the layer thickness $d_{HL}$ of the semiconductor layer HL, the diffusion length L of the minority carrier and the extent w of the space-charge zone. In the case of uniformity the semiconductor layer HL is optimally used down to the rear contact RK of the solar cell SZ and a safety overlap will result by going below the threshold value. The layer thickness $d_{HL}$ thus does not depend upon the absorption coefficient a or upon the absorption length $1/\alpha$ such that the layer thickness $d_{HL}$ of the semiconductor layer would have to be greater than $3/\alpha$ in order to achieve an optimum utilization of the layer of pure crystalline semiconductor material.

The metal nano emitters NE on the surface of the semiconductor layer HL are surrounded by a closed oxide layer OS the layer thickness of which has to be dimensioned sufficiently thick to provide an effective insulation of the metal nano emitters NE from each other and between the semiconductor layer HL and a transparent conductive layer TCO applied to the oxide layer OS. The metal nano emitters NE may penetrate slightly into the transparent conductive layer TCO. Owing to the division of the areas between the nano emitters NE such a solar cell SZ may be called a compact solar cell. Current collection takes place by way of the front contacts FK, for instance of strip or blade form, which are applied to the transparent conductive layer TCO. Here, too, as low a shadowing as possible is to be aimed at. In order further to improve the conversion efficiency there may be provided an anti reflection layer on the upper surface and a reflective surface on the rear surface in from of the rear contact of the solar cell SZ.

For preparing and modifying the oxide layer OS thin oxides of high electronic quality of the interface between the oxide and semiconductor layers may be wet-chemically precipitated. Further possibilities relate to fabricating anodic oxides followed by post-drying or to the use of electro-polished oxides followed by post-drying. Furthermore, thermally produced and native oxides may be used. The structuring of the oxide is preferably carried out mechanically, for instance by AFM by laterally shifting or penetrating the oxide layer OS.

For the purpose of local precipitation of nano emitters NE of metal on a semiconductor material, in this case p-Si, for forming Schottky contacts by a photo-induced electrochemical process, the energetic condition at the contact p-Si/metal/electrolyte at cathodic polarization of the silicon Si has to be taken into consideration. In this connection, a distinction is made between oxide-covered and oxide-free areas of the Si surface. The resultant light-induced processes have been depicted in energy band position diagrams (energy E over position x, $E_F$ Fermi level). FIG. 2 depicts the behavior of an uncovered section of the semiconductor layer HL for the subsequent positioning of a metal nano emitter NE at cathodic polarization (applied voltage $V_a$) and exposure (hv). The light-generated excess change carriers migrate either to the rear contact RK which in the embodiment is structured as a surface (holes (+)) or to the surface (electrons (−)). At an appropriate energetic position of the lower edge of the conductor band ($E_L$) and of a metal redox pair ($Me^{z+/0}$) the electrons may execute the reaction

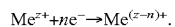

The metallic phase develops at n=z. By way of simplification, the following, for instance, holds true for mono-valued metal ions:

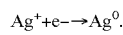

This leads to metal precipitation, and, hence, to the formation of the metal nano emitters NE, at the free surface and depth areas of the semiconductor layer HL. The metal precipitation may also be effected at n-Si by cathodic polarization in the dark (unexposed). In that case the conductor band electrons are to be considered as accumulated majority carriers. The light-induced precipitation at p-semiconductors and precipitation in the dark on n-semiconductors at cathodic (negative) potential represent—compared to the flat band situation—a very preserving and especially well defined process compared to vapor deposition, sputtering or etching away of metal films.

FIG. 3 depicts the corresponding behavior of oxide-covered areas of the semiconductor layer HL. At layer thicknesses $d_{ox}$ of the oxide layer, which are significantly greater than the so-called tunnel thickness ($d_{ox} \geq 3$ nm) the light-induced electrons are no longer transferred into the electrolyte. Instead, "trapping" as well as recombination occur at the adhesion positions at the surface of the semiconductor layer HL. At a sufficiently high electronic quality of the Si/oxide interface a charge carrier drift occurs in the direction of the metal nano emitters NE. This has been shown in FIG. 4.

The controlled exposing of contact areas on and in the semiconductor layer HL after formation of a thicker (for instance 10 nm) anodic oxide layer OS, the subsequent precipitation of metal nano emitters NE for fabricating rectifying nano contacts and the application of $SnO_2$, for instance, as a transparent conductive layer TCO makes possible a continuous production of a solar cell prepared completely by a wet or electrochemical process at a low temperature. The resultant process sequence saves energy and is cost-efficient.

LIST OF REFERENCE CHARACTERS

D distance between nano emitters
$d_{HL}$ Layer thickness of the semiconductor layer
$d_{ox}$ layer thickness of the oxide layer
FK front contact
HL semiconductor layer
L diffusion length of the minority carrier
NE nano emitter
OS oxide layer
RK rear contact
SZ solar cell
T penetration depth of the nano emitters
TCO transparent conductive layer
w extent of the space-carrier zone

What is claimed is:

1. A photovoltaic solar cell comprising:

an electric solid material contact between a semiconductor layer of layer thickness $d_{HL}$ and a plurality of metal nano emitters each of a space-charge zone of extent w within the semiconductor layer and embedded in an electrically insulating oxide layer applied on the semiconductor layer, wherein minority carriers migrate to the space-charge zone over a diffusion length L;

a transparent conductive layer electrically insulated from the semiconductor layer by the oxide layer; and front and rear contacts;

wherein the metal nano emitters (NE) form a Schottky contact and are three-dimensionally structured in an acicular or rib-like manner and are separated from each other by a uniform distance $D \leq \sqrt{2}L$ and penetrate into the semiconductor layer to a depth $$T \geq d_{HL} - \frac{L}{2} + w.$$

2. The photovoltaic solar cell in accordance with claim 1, wherein the metal nano emitters (NE) in the semiconductor layer (HL) are provided with lateral branches and/or extend obliquely in the semiconductor layer (HL).

3. The photovoltaic solar cell in accordance with claim 1, wherein a reflective surface is applied to the rear surface of the semiconductor layer (HL) in front of the rear contact (RK).

4. The photovoltaic solar cell in accordance with claim 1, wherein an antireflective layer is applied to the transparent conductive layer (TCO).

* * * * *